United States Patent
Kho et al.

(10) Patent No.: US 10,240,615 B1
(45) Date of Patent: Mar. 26, 2019

(54) APPARATUS, SYSTEM, AND METHOD FOR DAMPENING VIBRATIONS GENERATED BY EXHAUST FANS

(71) Applicant: Facebook, Inc., Menlo Park, CA (US)

(72) Inventors: Chuankeat Kho, San Jose, CA (US); Jason David Adrian, San Jose, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/713,609

(22) Filed: Sep. 23, 2017

(51) Int. Cl.
| | |
|---|---|
| *F04D 29/66* | (2006.01) |
| *G06F 1/20* | (2006.01) |
| *H05K 7/20* | (2006.01) |
| *H01L 23/467* | (2006.01) |
| *F04D 29/70* | (2006.01) |

(Continued)

(52) U.S. Cl.
CPC ......... *F04D 29/668* (2013.01); *F04D 29/664* (2013.01); *F04D 29/667* (2013.01); *F04D 29/703* (2013.01); *G06F 1/182* (2013.01); *G06F 1/20* (2013.01); *H01L 23/467* (2013.01); *H05K 7/20136* (2013.01); *F04D 29/646* (2013.01)

(58) Field of Classification Search
CPC ......... H01L 2924/0002; H01L 2924/00; H01L 23/467; G11B 33/08; G11B 33/128; G11B 33/142; G11B 7/123; G11B 7/1353; G11B 19/2009; G06F 1/20; G06F 1/181; G06F 1/203; G06F 1/183; G06F 1/182; F04D 25/08; F04D 29/30; F04D 29/668; F04D 29/665; F04D 25/0613; F04D 29/663; F04D 33/00; F04D 19/002; F04D 25/06; F04D 29/4226; F04D 29/664; F04D 25/026; F04D 29/063; F04D 29/282; F04D 29/384; F04D 29/646; F04D 29/667; F04D 29/703; H05K 7/20172; H05K 7/12; H05K 7/1487; H05K 7/20727; H05K 7/20336; H05K 7/20736; H05K 7/20809; H05K 7/20581; H05K 7/20136
See application file for complete search history.

(56) References Cited

U.S. PATENT DOCUMENTS

| | | |
|---|---|---|
| 294,800 A | 3/1884 | Madra |
| 3,996,500 A | 12/1976 | Coules |
| 4,969,065 A | 11/1990 | Petri |

(Continued)

OTHER PUBLICATIONS

Acoustic Attenuation; https://en.wikipedia.org/wiki/Acoustic_attenuation; Oct. 22, 2012.

(Continued)

*Primary Examiner* — Adam B Dravininkas
(74) *Attorney, Agent, or Firm* — FisherBroyles, LLP

(57) ABSTRACT

An apparatus for dampening vibrations generated by exhaust fans may include (1) at least one exhaust fan that (A) generates airflow across an array of storage devices that include rotating disks and (B) generates acoustic waves that produce propagating vibrations and (2) at least one acoustic attenuator that (A) includes a group of honeycomb-shaped openings that dampen the acoustic waves generated by the exhaust fan and (B) mitigates, by way of the honeycomb-shaped openings, interference to the rotating disks caused by the propagating vibrations produced by the acoustic waves. Various other apparatuses, systems, and methods are also disclosed.

18 Claims, 14 Drawing Sheets

(51) Int. Cl.
*G06F 1/18* (2006.01)
*F04D 29/64* (2006.01)

(56) References Cited

U.S. PATENT DOCUMENTS

| | | | |
|---|---|---|---|
| 5,281,149 A | 1/1994 | Petri | |
| 5,724,803 A | 3/1998 | Pea | |
| 5,793,614 A | 8/1998 | Tollbom | |
| 5,957,659 A * | 9/1999 | Amou | H01L 23/367 |
| | | | 257/E23.099 |
| 6,109,767 A * | 8/2000 | Rodriguez | G03B 21/16 |
| | | | 353/52 |
| 6,116,375 A * | 9/2000 | Lorch | G10K 11/172 |
| | | | 181/224 |
| 6,159,031 A | 12/2000 | Llapitan | |
| 6,181,549 B1 | 1/2001 | Mills | |
| 6,404,646 B1 | 6/2002 | Tsai | |
| 6,469,899 B2 | 10/2002 | Hastings | |
| 6,515,854 B1 | 2/2003 | Claprood | |
| 6,621,692 B1 | 9/2003 | Johnson | |
| 6,791,843 B1 | 9/2004 | Dobbs | |
| 6,798,669 B1 | 9/2004 | Hsu | |
| 6,813,165 B2 | 11/2004 | Cheng | |
| 6,987,674 B2 | 1/2006 | El-Batal | |
| 6,995,982 B2 | 2/2006 | Gonzalez | |
| 7,004,764 B2 | 2/2006 | Boudreau | |
| 7,084,654 B2 | 8/2006 | Zhao | |
| 7,088,579 B1 | 8/2006 | Konshak | |
| 7,167,371 B2 | 1/2007 | Coles | |
| 7,301,778 B1 | 11/2007 | Fang | |
| 7,411,787 B2 | 8/2008 | Katakura | |
| 7,505,286 B2 | 3/2009 | Brovald | |
| 7,515,413 B1 * | 4/2009 | Curtis | G06F 1/20 |
| | | | 165/104.33 |
| 7,649,750 B2 | 1/2010 | Lee | |
| 8,020,902 B1 | 9/2011 | Li | |
| 8,310,828 B2 | 11/2012 | Collins | |
| 8,570,720 B2 | 10/2013 | Yao | |
| 8,657,619 B2 | 2/2014 | Lin | |
| 8,749,966 B1 | 6/2014 | Boudreau | |
| 8,848,349 B2 | 9/2014 | Ke | |
| 8,944,538 B2 * | 2/2015 | Li | H05K 7/20172 |
| | | | 312/223.2 |
| 8,971,052 B2 | 3/2015 | Fu | |
| 9,066,438 B2 | 6/2015 | Chen | |
| 9,070,419 B1 | 6/2015 | Zhu | |
| 9,098,233 B2 | 8/2015 | Keffeler | |
| 9,101,210 B2 | 8/2015 | Lin | |
| 9,203,188 B1 | 12/2015 | Siechen | |
| 9,354,003 B2 | 5/2016 | Lin | |
| 9,456,519 B2 | 9/2016 | Bailey | |
| 9,461,389 B2 | 10/2016 | Novack | |
| 9,538,684 B2 | 1/2017 | Chen | |
| 9,545,028 B2 | 1/2017 | Hoshino | |
| 9,572,276 B2 | 2/2017 | Haroun | |
| 9,583,877 B1 | 2/2017 | Angelucci | |
| 9,609,778 B1 | 3/2017 | Spencer | |
| 9,763,350 B2 | 9/2017 | Rust | |
| 9,795,052 B2 | 10/2017 | Hsiao | |
| 2005/0238421 A1 | 10/2005 | Doerr | |
| 2006/0134953 A1 | 6/2006 | Williams | |
| 2006/0274508 A1 | 12/2006 | Lariviere | |
| 2007/0195542 A1 | 8/2007 | Metros | |
| 2007/0230111 A1 | 10/2007 | Starr | |
| 2007/0233781 A1 | 10/2007 | Starr | |
| 2008/0007913 A1 | 1/2008 | Tavassoli | |
| 2008/0117569 A1 * | 5/2008 | Lee | H05K 7/20145 |
| | | | 361/678 |
| 2009/0245745 A1 | 10/2009 | Krampotich | |
| 2009/0271950 A1 | 11/2009 | Wang | |
| 2009/0274429 A1 | 11/2009 | Krampotich | |
| 2009/0310303 A1 * | 12/2009 | Najbert | F04D 29/601 |
| | | | 361/695 |
| 2010/0195304 A1 | 8/2010 | Takao | |
| 2010/0296791 A1 | 11/2010 | Makrides-Saravanos | |
| 2011/0273850 A1 * | 11/2011 | Chen | H05K 5/0221 |
| | | | 361/726 |
| 2011/0309730 A1 | 12/2011 | Retchloff | |
| 2012/0004772 A1 | 1/2012 | Rahilly | |
| 2012/0020006 A1 | 1/2012 | Xu | |
| 2012/0134086 A1 | 5/2012 | Zhang | |
| 2012/0230815 A1 * | 9/2012 | Teramoto | F04D 25/0613 |
| | | | 415/200 |
| 2012/0257360 A1 | 10/2012 | Sun | |
| 2012/0305745 A1 * | 12/2012 | Chen | F04D 25/0613 |
| | | | 248/672 |
| 2013/0058054 A1 | 3/2013 | Zhou | |
| 2013/0258580 A1 | 10/2013 | Nakayama | |
| 2013/0325183 A1 | 12/2013 | Rahilly | |
| 2014/0111930 A1 | 4/2014 | Henderson | |
| 2014/0187068 A1 | 7/2014 | Chia | |
| 2014/0369002 A1 * | 12/2014 | Takeuchi | F04D 25/0613 |
| | | | 361/695 |
| 2015/0156912 A1 | 6/2015 | Liang | |
| 2015/0163946 A1 | 6/2015 | Kyle | |
| 2015/0208548 A1 * | 7/2015 | Chu | H05K 7/20172 |
| | | | 361/695 |
| 2015/0235673 A1 | 8/2015 | Lo | |
| 2016/0150659 A1 | 5/2016 | Chen | |
| 2016/0150667 A1 | 5/2016 | Xu | |
| 2016/0330858 A1 | 11/2016 | Ehlen | |

OTHER PUBLICATIONS

Electromagnetic Shielding; https://en.wikipedia.org/wiki/Electromagnetic_shielding; May 15, 2016.

* cited by examiner

Method
1300

```
                    ┌─────────┐
                    │  Start  │
                    └────┬────┘
                         ▼
┌──────────────────────────────────────────────────────────────────────────────┐
│ Secure, within a cage removably coupled to an array of storage devices that  │
│ include rotating disks, an exhaust fan that (1) generates airflow across the │
│ array of storage devices and (2) generates acoustic waves that produce       │
│ propagating vibrations                                                       │
│                                 1310                                         │
└──────────────────────────────────┬───────────────────────────────────────────┘
                                   ▼
┌──────────────────────────────────────────────────────────────────────────────┐
│ Incorporate, within a chassis that houses the array of storage devices, at   │
│ least one acoustic attenuator that (1) includes a group of honeycomb-shaped  │
│ openings that dampen the acoustic waves generated by the exhaust fan and (2) │
│ mitigates, by way of the honeycomb-shaped openings, interference to the      │
│ rotating disks caused by the propagating vibrations produced by the acoustic │
│ waves                                                                        │
│                                 1320                                         │
└──────────────────────────────────┬───────────────────────────────────────────┘
                                   ▼
                             ┌─────────┐
                             │   End   │
                             └─────────┘
```

*FIG. 13*

APPARATUS, SYSTEM, AND METHOD FOR DAMPENING VIBRATIONS GENERATED BY EXHAUST FANS

BACKGROUND

Individuals and organizations increasingly generate and store vast amounts of data. For example, some websites (such as social media platforms) may allow users to upload practically unlimited amounts of text, pictures, videos, and other types of media. Websites typically store this data in servers and/or data centers such that the data may later be accessed by users. This storage burden is further increased by the fact that many websites and/or data centers create and store duplicate copies of data for disaster-recovery, testing, regulatory, or other purposes.

To accommodate the ever-growing storage demands of consumers, data storage centers may often manage many thousands of storage devices. In some examples, these storage devices may be housed within aisles of drawers and/or racks. Operating such large numbers of storage devices (and especially when the devices are in close proximity with one another) may require extensive and/or powerful cooling systems to ensure the devices maintain a suitable operating temperature. Such cooling systems may often involve fans that dissipate heat generated by the storage devices. Unfortunately, some conventional heat-dissipation systems may disrupt the performance of the devices that they are designed to cool. For example, the rotation of blades within a fan may generate acoustic waves and/or rotational vibrations that interfere with the rotation of hard disk drives. As a result, the disks may be unable to accurately and/or efficiently store and retrieve data. The instant disclosure, therefore, identifies and addresses a need for improved heat-dissipation systems for storage devices.

SUMMARY

As will be described in greater detail below, the instant disclosure describes various apparatuses, systems, and methods for dampening acoustic waves and rotational vibrations generated by exhaust fans. For example, the disclosed embodiments may incorporate acoustic attenuators into an enclosure that houses an array of storage devices that are cooled by one or more exhaust fans. Embodiments of the instant disclosure may also facilitate easy and efficient removal of an exhaust fan cage from a storage device chassis.

In one example, an apparatus for dampening vibrations generated by exhaust fans may include (1) at least one exhaust fan that (A) generates airflow across an array of storage devices that include rotating disks and (B) generates acoustic waves that produce propagating vibrations and (2) at least one acoustic attenuator that (A) includes a group of honeycomb-shaped openings that dampen the acoustic waves generated by the exhaust fan and (B) mitigates, by way of the honeycomb-shaped openings, interference to the rotating disks caused by the propagating vibrations produced by the acoustic waves.

In some embodiments, the array of storage devices may be housed in a chassis. In these embodiments, the acoustic attenuator may include a sheet that is inserted into a slot within the chassis. In one example, this sheet may be composed of foam designed to dampen acoustic waves. Alternatively, this sheet may be composed of metal that shields the array of storage devices from electromagnetic waves generated by the exhaust fan.

In some embodiments, the apparatus may include a cage that secures the exhaust fan. The apparatus may also include a cage tray that couples the cage to the chassis that houses the array of storage devices. In one example, the cage may include at least one fan guard that secures the exhaust fan within the cage. This fan guard may be positioned between the cage and the array of storage devices. In one embodiment, the honeycomb-shaped openings of the acoustic attenuator may be incorporated into the fan guard.

In some examples, the cage may include at least one component designed to dampen rotational vibrations generated by the exhaust fan. For example, the cage may include a rubber gusset that at least partially secures the exhaust fan within the cage. Additionally or alternatively, the cage may include a foam sheet secured to at least one side of the cage.

In some embodiments, the cage may include at least one additional group of honeycomb-shaped openings that is designed to shield electrical devices from electromagnetic waves generated by the exhaust fan. In addition, the cage may include a latch. This latch may be capable of being engaged with and/or disengaged from the cage tray via a spring-biased plunger that is inserted into an opening within the cage tray. In one example, engaging the latch with the cage tray may secure the cage to the cage tray. In addition, disengaging the latch from the cage tray may facilitate removal of the cage from the cage tray. In one embodiment, the latch may include and/or represent a handle that facilitates one-handed removal of the cage from the cage tray.

In one embodiment, a system for dampening vibrations generated by exhaust fans may include (1) at least one exhaust fan that (A) generates airflow across an array of storage devices that include rotating disks and (B) generates acoustic waves that produce propagating vibrations, (2) at least one acoustic attenuator that (A) includes a group of honeycomb-shaped openings that dampen the acoustic waves generated by the exhaust fan and (B) mitigates, by way of the honeycomb-shaped openings, interference to the rotating disks caused by the propagating vibrations produced by the acoustic waves, and (3) a chassis that houses both the array of storage devices and the acoustic attenuator.

In addition, a corresponding method for dampening vibrations generated by exhaust fans may include (1) securing, within a cage removably coupled to an array of storage devices that include rotating disks, an exhaust fan that (A) generates airflow across the array of storage devices (B) generates acoustic waves that produce propagating vibrations and (2) incorporating, within a chassis that houses the array of storage devices, at least one acoustic attenuator that (A) includes a group of honeycomb-shaped openings that dampen the acoustic waves generated by the exhaust fan and (B) mitigates, by way of the honeycomb-shaped openings, interference to the rotating disks caused by the propagating vibrations produced by the acoustic waves.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 13 is a flow diagram of an exemplary method for assembling systems that dampen vibrations generated by exhaust fans.

Figure 1A:
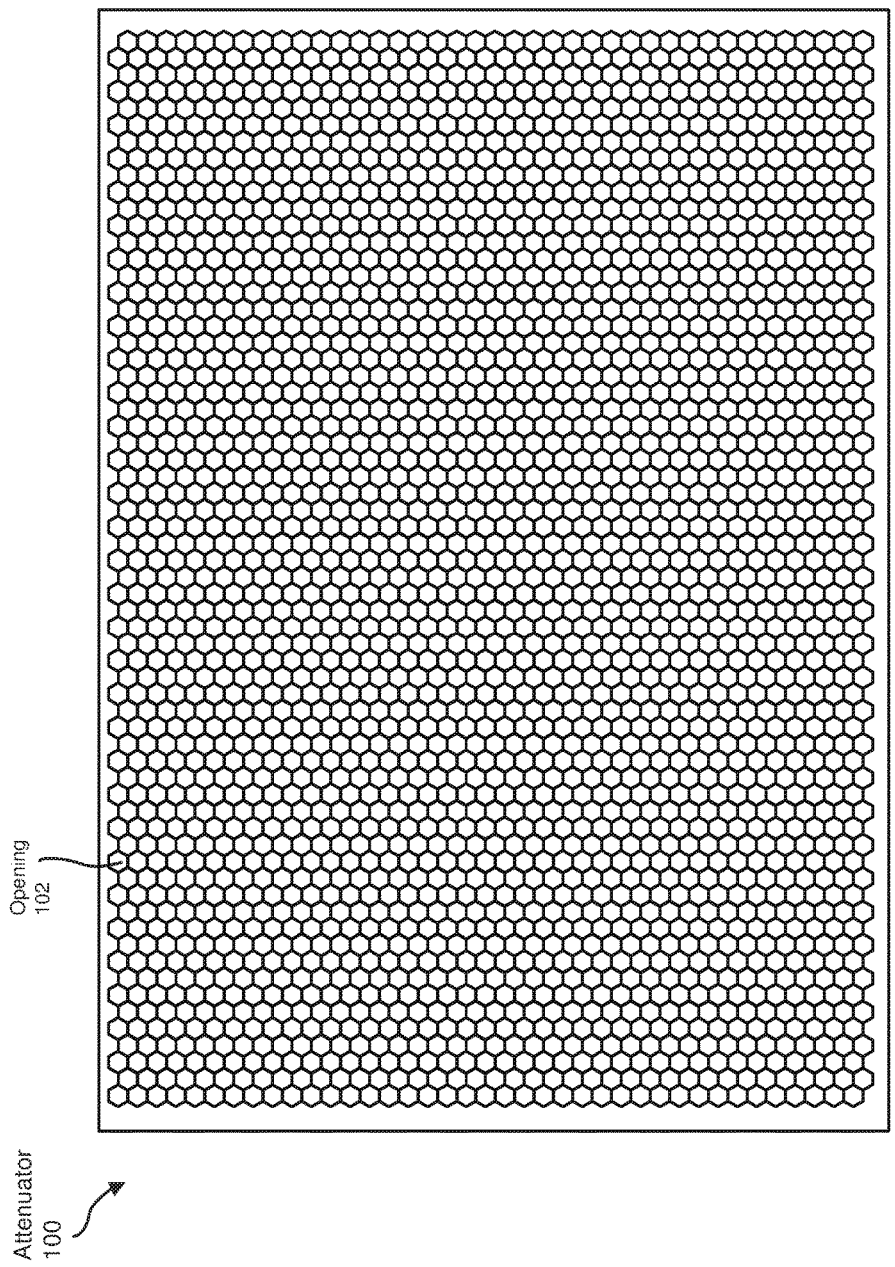
FIG. 1A is an illustration of an exemplary attenuator that dampens acoustic waves.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatuses, systems, and methods for dampening both acoustic waves and rotational vibrations generated by exhaust fans. As will be explained in greater detail below, embodiments of the instant disclosure may incorporate one or more acoustic attenuators into an enclosure that houses an array of storage devices. These acoustic attenuators may represent metal and/or foam sheets that contain groups of honeycomb-shaped openings.

When the acoustic attenuators are positioned between the storage devices and one or more exhaust fans that cool the storage devices, the honeycomb-shaped openings may terminate and/or dissipate acoustic waves generated by rotation of the fans. Accordingly, the attenuators may prevent acoustic vibrations induced by the fans from propagating towards the storage devices. In some examples, the honeycomb-shaped openings may also be designed to shield the storage devices from electromagnetic radiation produced by the fans.

Additionally, embodiments of the instant disclosure may incorporate one or more vibration-dampening mechanisms into a cage or enclosure that secures an exhaust fan. For example, an exhaust fan cage may include a rubber gusset and/or a foam cover that dampen rotational vibrations generated by rotation of the exhaust fan. Because acoustic-induced vibrations, rotational vibrations, and/or electromagnetic fields may interfere with both mechanical and electrical components of storage devices, the disclosed embodiments may ensure optimal and/or proper operation of these devices.

The disclosed embodiments may also facilitate easy and/or efficient removal of an exhaust fan cage from an enclosure that houses the devices cooled by the exhaust fan. For example, the disclosed apparatuses may include a handle that is attached to an exhaust fan cage. This handle may be capable of being engaged with and/or disengaged from a chassis that houses an array of storage devices (e.g., via a mechanism such as a spring-biased plunger). When the handle is disengaged from the enclosure, a technician may pull and/or rotate the handle to separate the cage from the enclosure. In some examples, this separation may be performed using a continuous and/or one-handed motion. As such, the disclosed heat-dissipation apparatuses may be easily and efficiently moved, inspected, and/or repaired.

Figure 1B:
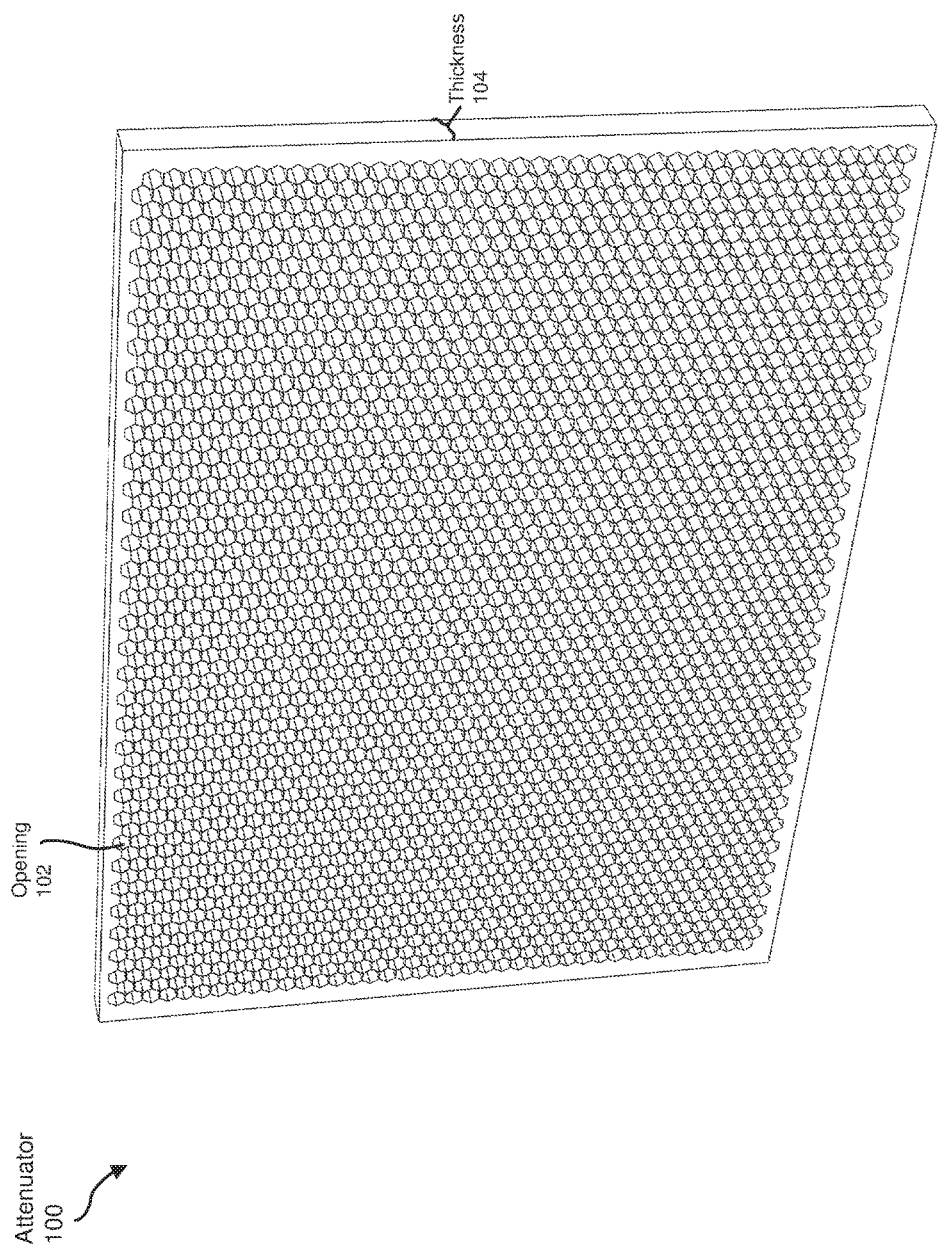
FIG. 1B is a perspective view of an exemplary attenuator that dampens acoustic waves.

The following will provide, with reference to FIGS. 1A and 1B, detailed descriptions of exemplary attenuators that dampen acoustic waves. Detailed descriptions of exemplary apparatuses that house one or more exhaust fans will be provided in connection with FIGS. 2-5 and 10-12. In addition, detailed descriptions of exemplary systems for housing and cooling storage devices will be provided in connection with FIGS. 6 and 7. Detailed descriptions of exemplary components for securing acoustic attenuators will be provided in connection with FIGS. 8 and 9. Finally, detailed descriptions of exemplary methods for assembling systems that dampen acoustic waves generated by exhaust fans will be provided in connection with FIG. 13.

FIG. 1A illustrates a front view of an attenuator 100. Attenuator 100 generally represents any device, structure, and/or material that dampens, terminates, dissipates, and/or otherwise diminishes acoustic waves. As used herein, the term "acoustic wave" generally refers to any longitudinal wave generated and/or produced as a result of movement and/or vibration of one or more mechanical components. As an example, the rotation of blades within a fan may generate acoustic waves.

In some embodiments, acoustic waves may disturb and/or disrupt the performance of nearby mechanical components. For example, high-frequency acoustic waves may induce vibrations within mechanical components designed to rotate (such as hard disk drives), thereby interfering with the movement of these components. As will be explained in greater detail below, embodiments of attenuator 100 may mitigate the impact that acoustically induced vibrations generated by an exhaust fan have on the performance of storage devices cooled by the exhaust fan.

In some embodiments, attenuator 100 may represent a sheet or panel that contains a group of holes and/or openings. These openings may be designed to absorb and/or dissipate acoustic waves generated by rotating mechanical components. In this way, attenuator 100 may prevent vibrations induced by acoustic waves from propagating beyond attenuator 100. In the example of FIG. 1, attenuator 100 may include multiple instances of an opening 102. As shown in FIG. 1, these openings may represent and/or form honeycomb-shaped (e.g., hexagonal) holes. In some embodiments, these honeycomb-shaped openings may facilitate greater dissipation of acoustic waves than openings of alternative shapes (e.g., squares, circles, etc.).

Attenuator 100 may be composed of any suitable material that is capable of dampening acoustic waves. In one example, attenuator 100 may be composed of a foam or similar material that is designed to maximize the dissipation of acoustic waves. In other examples, attenuator 100 may be composed of a variety of metals. In these examples, attenuator 100 may also be capable of shielding electrical components from electromagnetic radiation, electromagnetic fields, and/or electrostatic fields. For example, the metal openings of attenuator 100 may act as a Faraday cage or a similar type of electromagnetic interference (EMI) shield. In this way, attenuator 100 may serve the dual purpose of blocking acoustic waves and electromagnetic waves, thereby optimizing the performance of both nearby mechanical and electrical devices.

In some embodiments, the size, placement, and/or number of openings within attenuator 100 may be designed to maximize the dissipation of propagating acoustic waves and/or electromagnetic radiation. For example, the dimensions of opening 102 may be selected based at least in part on the wavelength of acoustic waves generated by nearby devices. Moreover, the thickness or width of attenuator 100 may be designed to ensure that acoustic waves and/or electromagnetic radiation is sufficiently absorbed by attenuator 100. For example, attenuator 100 may be several millimeters thick or several centimeters thick. FIG. 1B shows an example perspective view of attenuator 100 that illustrates the thickness of attenuator 100. In this example, each of openings 102 within attenuator 100 may have a depth corresponding to a thickness 104.

As discussed above, attenuator 100 may be designed to dissipate acoustic waves generated by one or more fans. The term "fan," as used herein, generally refers to any device or assembly that includes rotating blades designed to generate airflow. In some examples, the airflow generated by a fan may be used to dissipate heat generated by one or more mechanical and/or electrical devices, thereby enabling the devices to maintain a suitable operating temperature.

Figure 2:
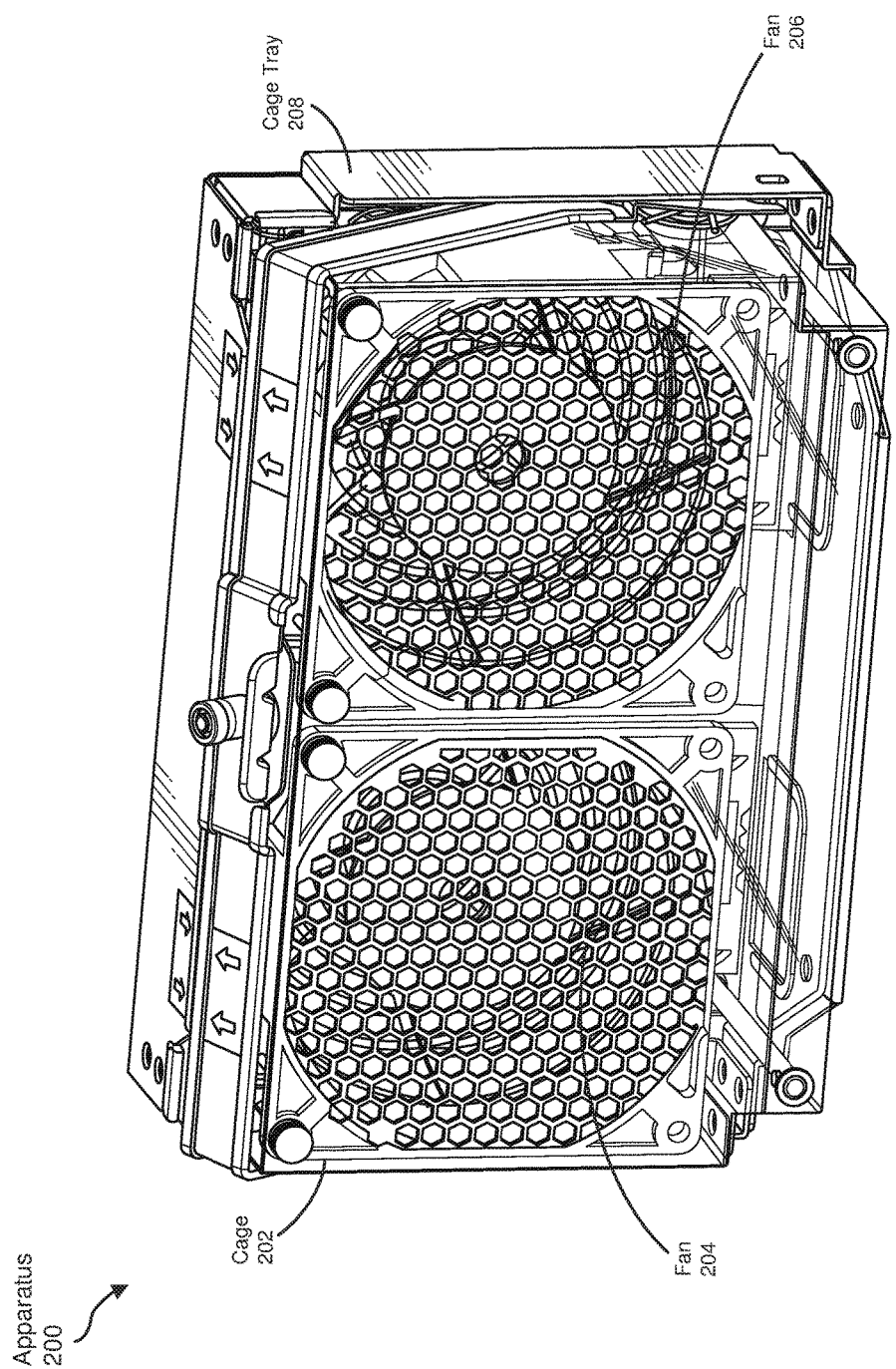
FIG. 2 is an illustration of an exemplary apparatus that houses one or more exhaust fans.

FIG. 2 illustrates an exemplary apparatus 200 that includes one or more fans. As shown in FIG. 2, apparatus 200 may include a cage 202 that secures and/or houses a fan 204 and/or a fan 206. Cage 202 generally represents any type or form of enclosure, chassis, or structure designed to hold and/or operate at least one fan. In addition, cage 202 may be composed of any suitable material, including various types of metals, plastics, and/or synthetic materials. In one embodiment, fans 204 and 206 may represent exhaust fans. As used herein, the term "exhaust fan" generally refers to any type of fan that induces airflow over a heat-generating device by creating a vacuum over and/or around the device. Fans 204 and 206 may each represent any additional type of fan, such as a ventilation fan.

In addition, apparatus 200 may include a cage tray 208. Cage tray 208 generally represents any type or form of mechanism, slot, and/or device that holds and/or is removably coupled to cage 202. In some examples, cage tray 208 may couple cage 202 to one or more heat-generating devices such that fans 204 and 206 may dissipate heat generated by the devices. In particular, cage tray 208 may couple cage 202 to one or more storage devices. The term "storage device," as used herein, generally refers to any system and/or device capable of storing and/or retrieving data. In one embodiment, cage 202 may be coupled to an enclosure that houses an array of hard drives that include rotating disks. In this embodiment, the components of apparatus 200 may be designed to provide heat dissipation for the hard drives via exhaust fans and/or mitigate interference to the hard drives due to rotational vibrations produced by the exhaust fans.

Figure 3:
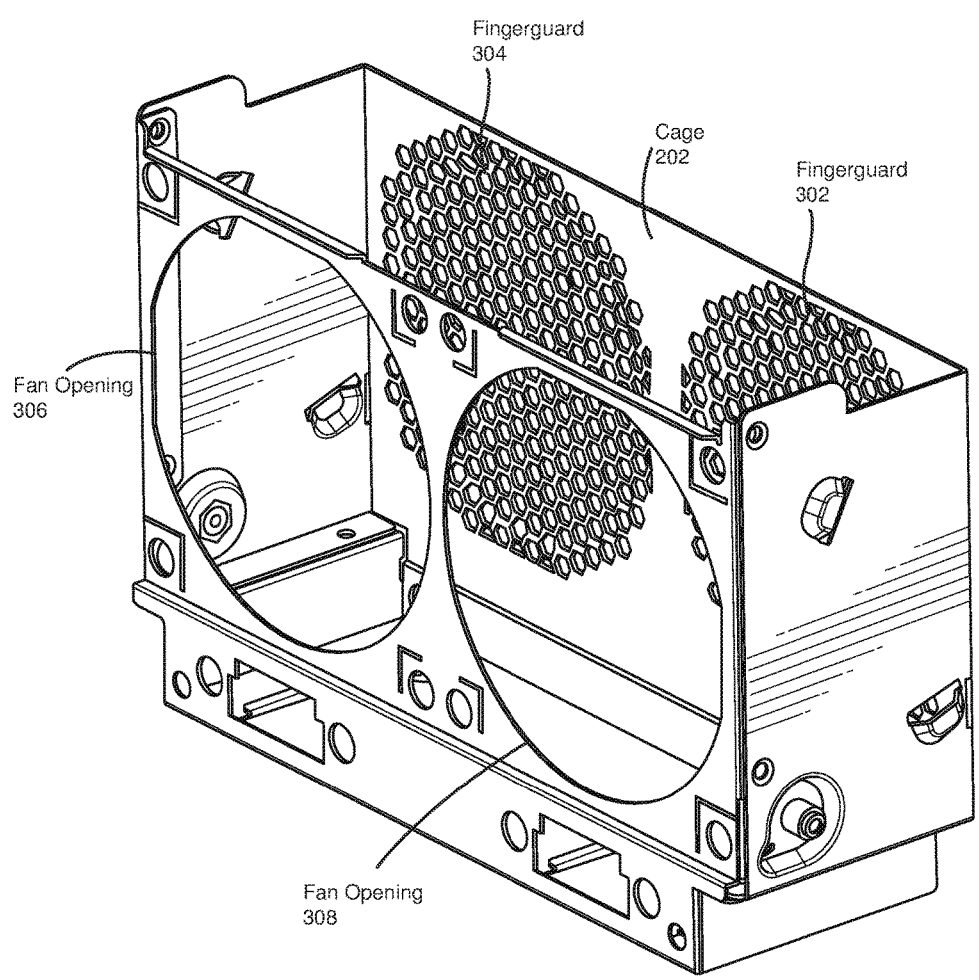
FIG. 3 is an illustration of exemplary cage that houses one or more exhaust fans.

FIG. 3 shows an exemplary embodiment of cage 202. As shown in FIG. 3, cage 202 may include a fan opening 306 and a fan opening 308. These openings may enable fans 204 and 206 to generate airflow across an array of storage devices that is coupled to cage 202. In some examples, cage 202 may also include a fingerguard 302 and/or a fingerguard 304. As shown in FIG. 3, fingerguards 302 and 304 may each represent and/or include a group of openings within one or more sides of cage 202 (e.g., the side of cage 202 opposite fan openings 306 and 308). These fingerguards may provide and/or represent a variety of features for cage 202. For example, fingerguards 302 and 304 may prevent users from physically touching fans 204 and 206 while the fans are operating, thereby ensuring the safety of both the users and the fans. In addition, the openings of fingerguards 302 and 304 may enable air to flow out of cage 202.

In some embodiments, the openings of fingerguards 302 and 304 may also function as EMI shields. For example, fingerguards 302 and 304 may be designed to shield and/or block electromagnetic radiation generated by fans 204 and 206. In the example of FIG. 3, fingerguards 302 and 304 may represent groups of honeycomb-shaped openings that are incorporated into cage 202. The size of these openings and/or the thickness of cage 202 may be designed to prevent at least a portion of the electromagnetic radiation generated by fans 204 and 206 from travelling beyond cage 202. Furthermore, in some embodiments, the openings of fingerguards 302 and 304 may be dimensioned, similar to attenuator 100 in FIG. 1, so as to dampen acoustic waves and/or rotational vibrations.

Fans 204 and 206 may be positioned within cage 202 in any suitable manner. In one example, fan 204 may be positioned between fan opening 308 and fingerguard 302. Specifically, fan 204 may face fingerguard 302 such that fan 204 generates airflow in a direction going from fan opening 308 to fingerguard 302. Similarly, fan 206 may be positioned between fan opening 306 and fingerguard 304 such that fan 206 generates airflow in a direction going from fan opening 306 to fingerguard 304.

Figure 4:
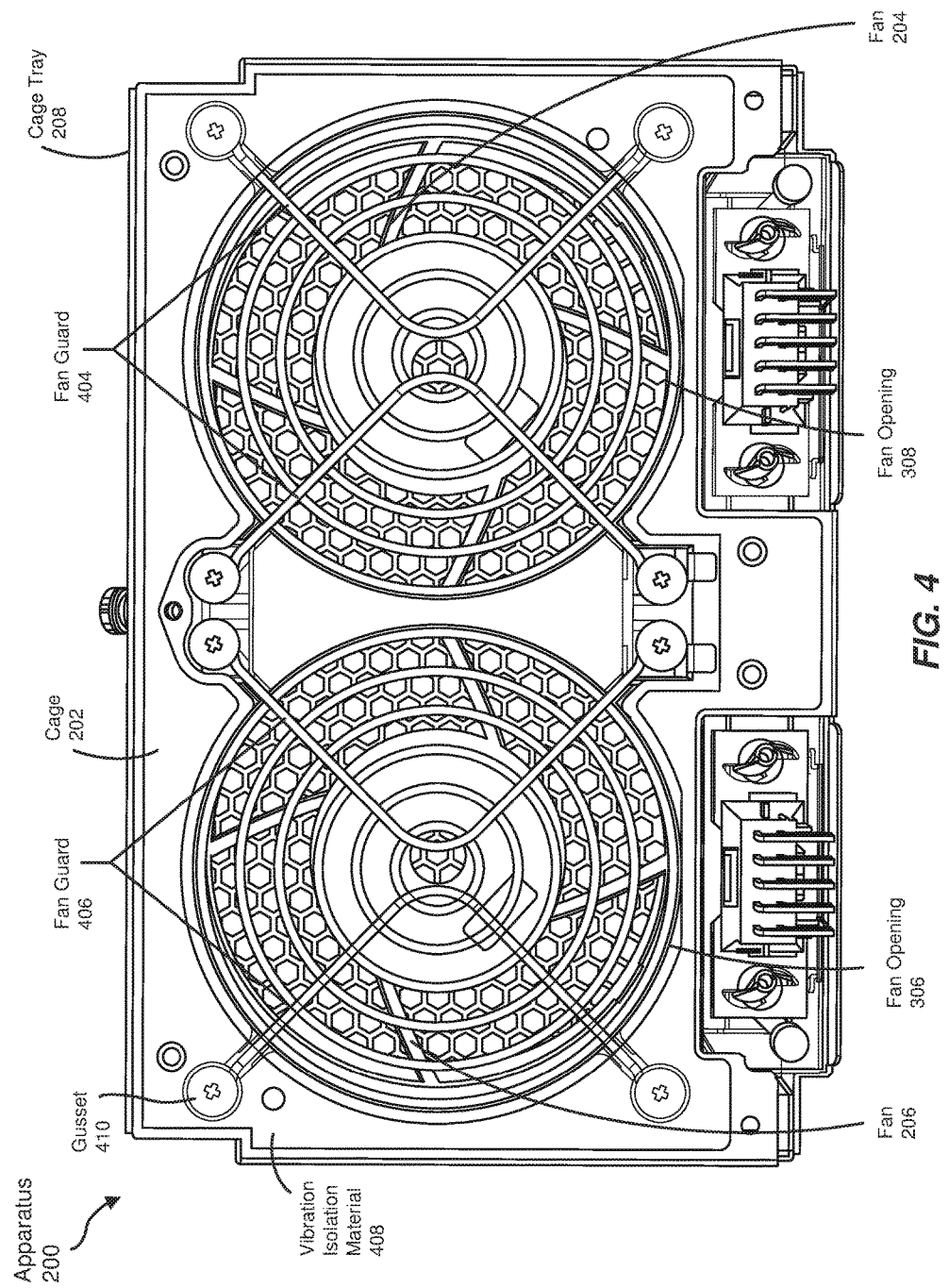
FIG. 4 is a back view of an exemplary apparatus that houses one or more exhaust fans.

FIG. 4 illustrates an example configuration of fans 204 and 206 within cage 202. In this example, fan 204 may be secured within cage 202 at least in part by a fan guard 404. Similarly, fan 206 may be secured within cage 202 at least in part by a fan guard 406. Fan guards 404 and 406 generally represent any type or form of barrier, protector, and/or mount that secures fan 204 and/or fan 206 within cage 202 while allowing air to flow through cage 202. In some examples, fan guards 404 and 406 may also reduce audible noise produced by rotating blades of fans 204 and 206. In the example of FIG. 4, fan guards 404 and 406 may represent one or more metal and/or plastic wires positioned over fan openings 306 and 308. In other embodiments, and as will be explained in greater detail below, fan guards 404 and 406 may represent and/or include attenuator 100. Cage 202 may also include any additional or alternative guards that secure fans 204 and 206.

In the example of FIG. 4, apparatus 200 may include one or more components designed to dampen rotational vibrations. The term "rotational vibrations," as used herein, generally refers to any propagating vibrations that are generated by moving (e.g., rotating) mechanical parts. In one example, the rotation of blades within an exhaust fan may generate rotational vibrations that travel through a cage that secures the exhaust fan and/or additional components coupled to the cage. As with rotations induced by acoustic waves, rotational vibrations may interfere with rotating mechanical devices (such as hard disk drives).

As shown in FIG. 4, apparatus 200 may include a vibration isolation material 408. Vibration isolation material 408 generally represents any type or form of sheet or covering that is coupled to cage 202 and is designed to absorb vibrations generated within cage 202. In this way, vibration isolation material 408 may help prevent these vibrations from propagating beyond cage 202. Vibration isolation material 408 may include and/or be composed of a variety of materials, including foam and/or sponge materials.

Apparatus 200 may also include one or more instances of a gusset 410. Gusset 410 generally represents any type or form of attachment, plug, connector, and/or other mechanism that dampens vibrations between one or more components of apparatus 200. In one embodiment, gusset 410 may represent a bolt or screw that is inserted into and/or through multiple components of apparatus 200. Gusset 410 may be composed of any suitable material (e.g., rubber) that terminates and/or absorbs vibrations.

Figure 5:
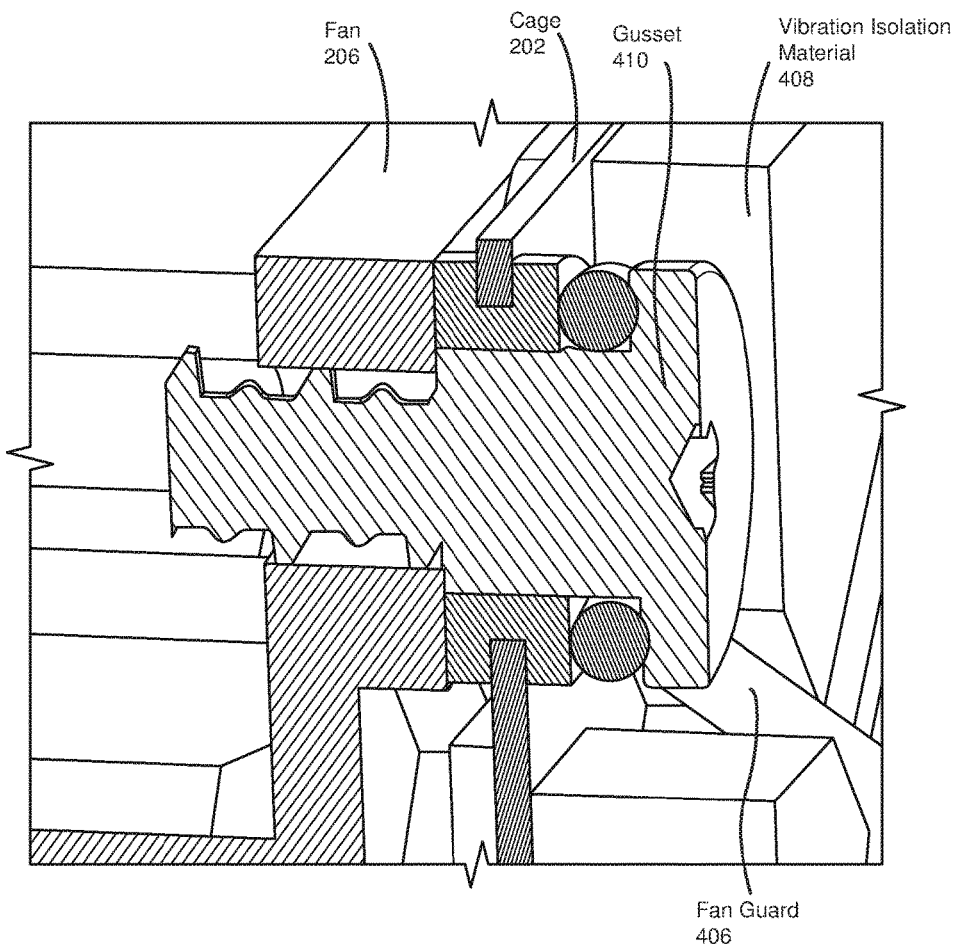
FIG. 5 is an illustration of an exemplary component for dampening vibrations.

FIG. 5 illustrates a cross-sectional view of gusset 410. As shown in FIG. 5, gusset 410 may be coupled to fan 206, cage 202, vibration isolation material 408, and/or fan guard 406. In one example, gusset 410 may help secure fan guard 406 and/or vibration isolation material 408 to cage 202. In addition, one end of gusset 410 may physically contact fan 206 such that gusset 410 absorbs at least a portion of the vibrations generated by fan 206.

Figure 6:
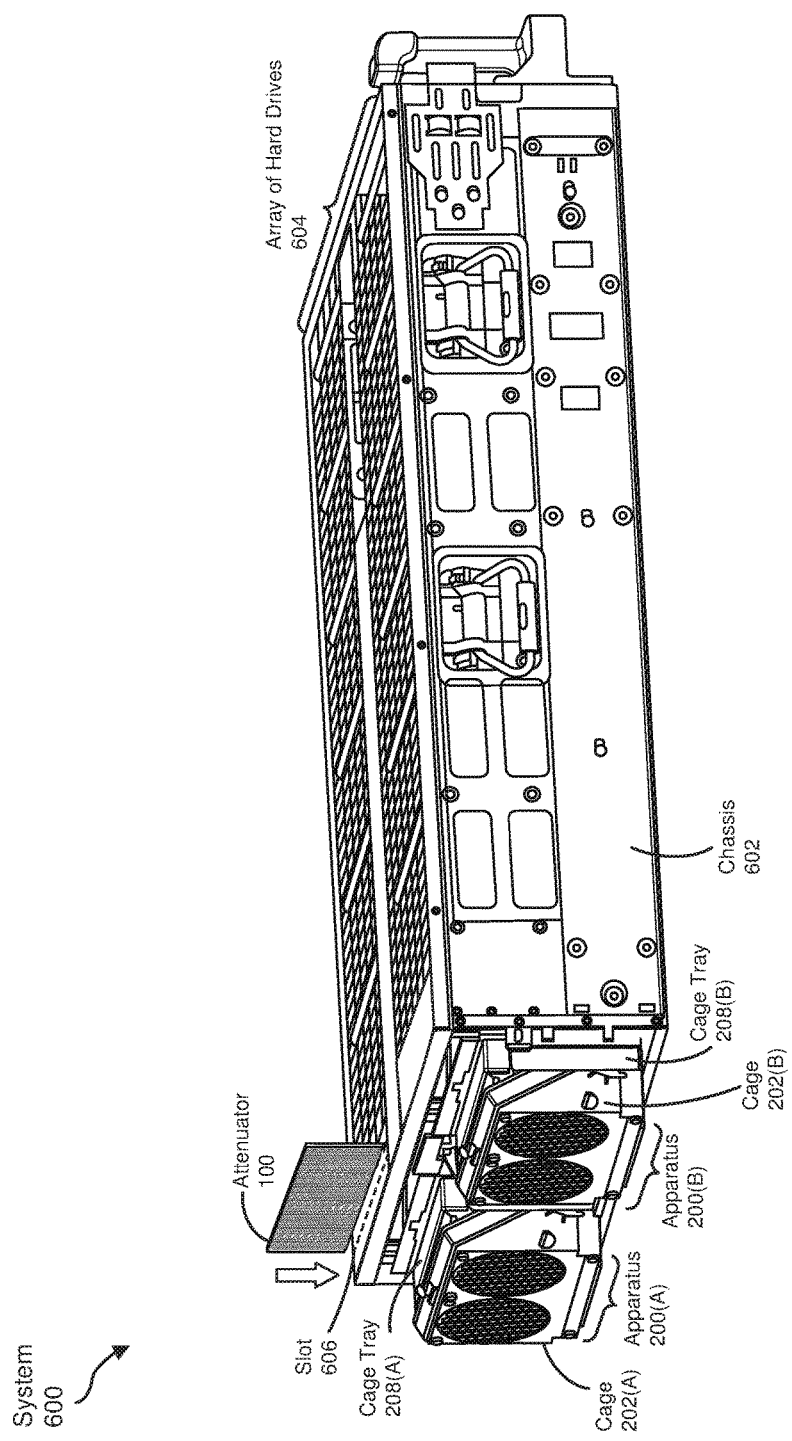
FIG. 6 is an illustration of an exemplary system for housing and cooling storage devices.

As discussed above, fans 204 and 206 within apparatus 200 may generate airflow across one or more storage devices. Accordingly, one or more instances of apparatus 200 may be coupled to an enclosure that houses an array of storage devices. As an example, FIG. 6 illustrates a system 600 that includes an apparatus 200(A) and an apparatus 200(B). In this example, apparatuses 200(A) and 200(B) may be coupled to a chassis 602 that stores an array of hard drives 604. Array of hard drives 604 generally represents any set or number of hard drives that each contain one or more rotating disks. Chassis 602 generally represents any type or form of housing, structure, and/or enclosure that secures and/or holds array of hard drives 604. In one embodiment, chassis 602 may represent a drawer and/or rack of hard drives managed by a data center.

In the example of FIG. 6, one or more instances of attenuator 100 may be positioned between the fans within apparatuses 200(A) and 200(B) and array of hard drives 604. Attenuator 100 may be coupled between these components in a variety of ways. In one embodiment, attenuator 100 may be incorporated directly into apparatus 200. For example, as mentioned above, attenuator 100 may replace and/or be incorporated into fan guards 404 and 406. Specifically, attenuator 100 may be positioned over fan openings 306 and 308 such that attenuator 100 both dampens acoustic waves generated by fans 204 and 206 and secures fans 204 and 206 within cage 202.

In other embodiments, attenuator 100 may be incorporated into chassis 602. Specifically, attenuator 100 may be inserted into a slot 606 that is located between apparatus 200 and at least a portion of the hard drives within array 604. Slot 606 may be positioned at any suitable location within chassis 602, such as several centimeters or several inches from the edge of chassis 602 that is coupled to apparatus 200.

Figure 7:
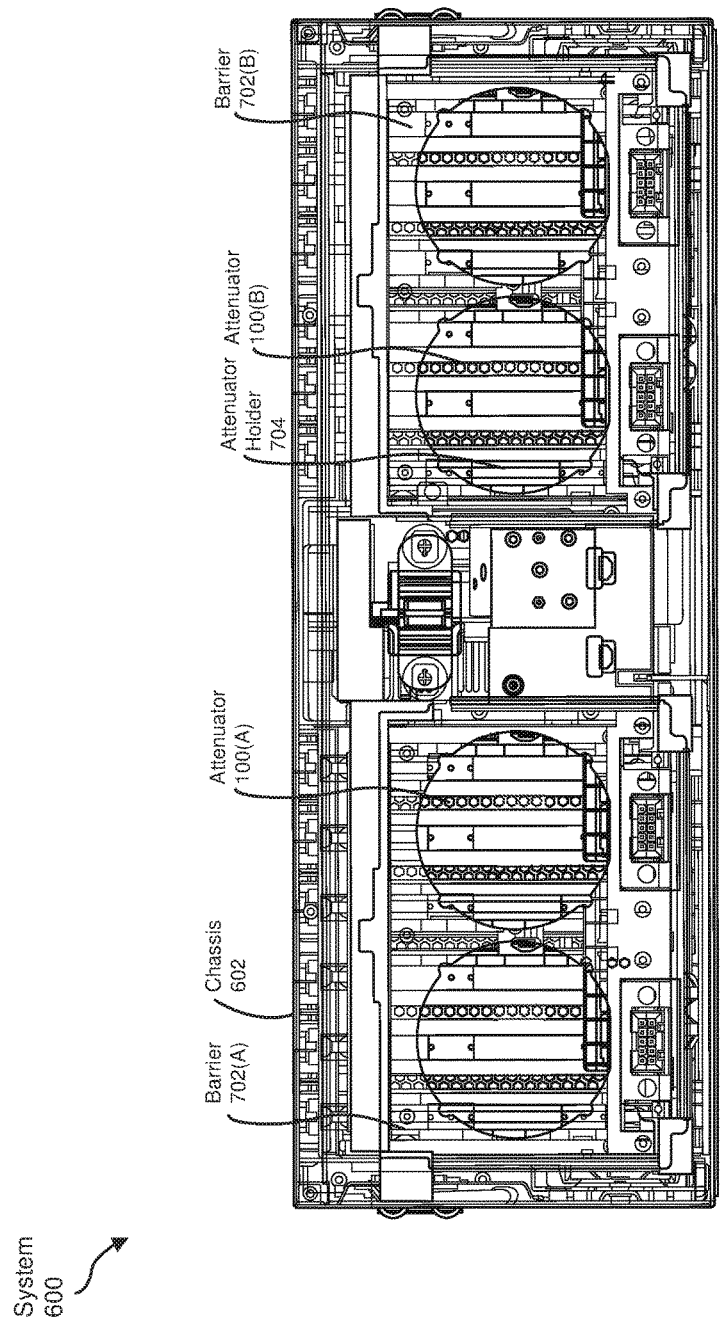
FIG. 7 is a cross-sectional view of an exemplary system for housing and cooling storage devices.

FIG. 7 illustrates an exemplary implementation of attenuator 100 within chassis 602. Specifically, FIG. 7 shows a cross-sectional view of system 600 when apparatuses 200(A) and 200(B) are not coupled to chassis 602. As illustrated in FIG. 7, attenuators 100(A) and 100(B) may be visible behind one or more components of chassis 602. For example, attenuator 100(A) may be positioned behind a barrier 702(A) that separates apparatus 200(A) from chassis 602. Similarly, attenuator 100(B) may be positioned behind a barrier 702(B) that separates apparatus 200(B) from chassis 602. In some examples, barriers 702(A) and 702(B) may contain holes that are sized to correspond to the size of fan openings 306 and 308. Barriers 702(A) and 702(B) may be composed of any suitable material, including a variety of types of metal and/or plastic.

As shown in FIGS. 6 and 7, attenuators 100(A) and 100(B) may be positioned in front of array of hard drives 604. In this way, attenuators 100(A) and 100(B) may dampen acoustic waves generated by the fans within apparatuses 200(A) and 200(B) such that the vibrations produced by the acoustic waves do not reach array of hard drives 604. Additionally or alternatively, attenuators 100(A) and 100(B) may shield array of hard drives 604 from electromagnetic radiation generated by components of apparatuses 200(A) and 200(B).

Attenuators 100(A) and 100(B) may be of any size that fits securely within chassis 602. In some examples, attenuators 100(A) and 100(B) may also be sized to facilitate and/or maximize dissipation of acoustic waves generated by the fans within apparatuses 200(A) and 200(B). For example, the size of attenuator 100 may correspond (or approximately correspond) to the cross-sectional area of apparatus 200.

In some embodiments, attenuators 100(A) and 100(B) may be secured within chassis 602 via one or more attenuator holders, such as an attenuator holder 704. Attenuator holder 704 generally represents any structure and/or attachment mechanism that facilitates and/or creates a slot into which attenuator 100 may be inserted. In one example, the placement of attenuator holder 704 within chassis 602 may define and/or correspond to slot 606 in FIG. 6.

Figure 8:
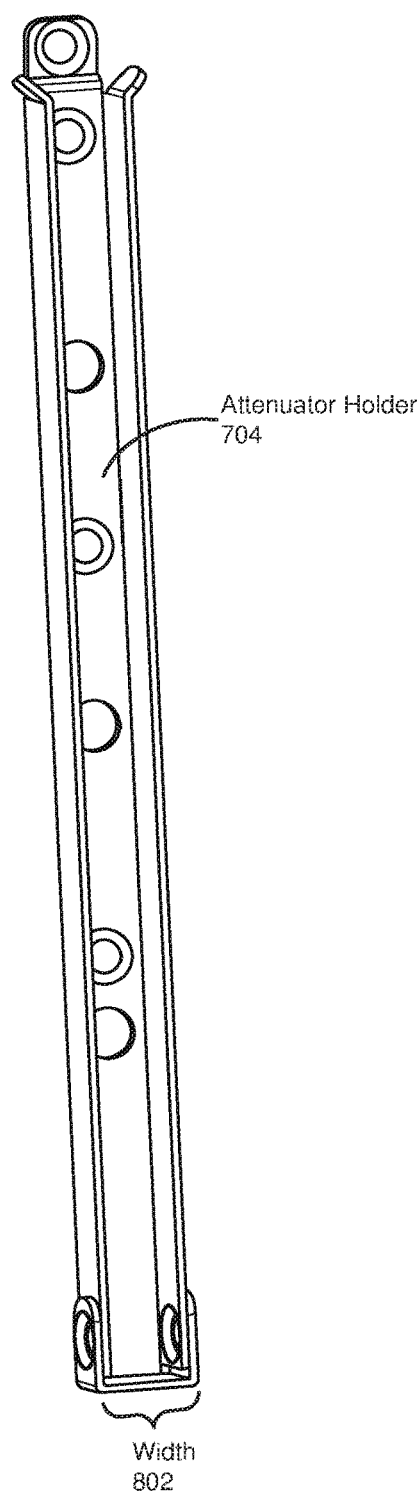
FIG. 8 is an illustration of an exemplary component for securing acoustic attenuators.

FIG. 8 illustrates an exemplary embodiment of attenuator holder 704. In this example, attenuator holder 704 may be sized to securely hold and/or contain attenuator 100. For example, a width 802 of attenuator holder 704 may correspond to the thickness of attenuator 100 (e.g., thickness 104 in FIG. 1B). In some embodiments, attenuator holder 704 may contain one or more openings by which attenuator holder 704 may be attached (e.g. bolted or screwed) to components within chassis 602.

Figure 9:
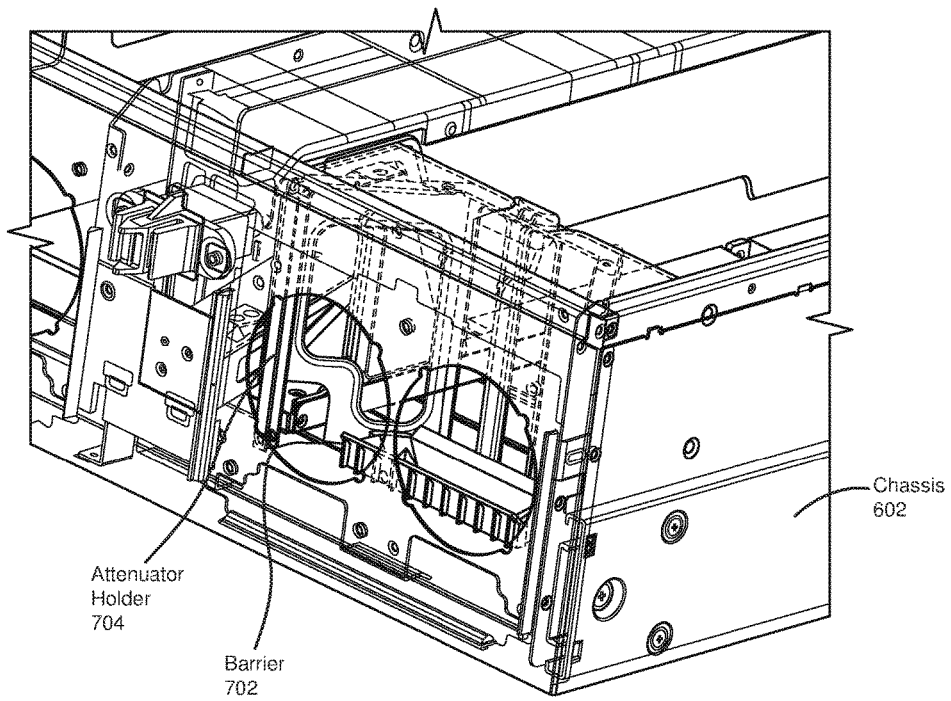
FIG. 9 is an additional cross-sectional view of an exemplary system for housing and cooling storage devices.

FIG. 9 illustrates an exemplary implementation of attenuator holder 704 within chassis 602. As shown in FIG. 9, attenuator holder 704 may be positioned vertically within chassis 602 behind barrier 702. In one example, attenuator 100 may be inserted into a slot created by two instances of attenuator holder 704. For example, chassis 602 may include an additional attenuator holder 704 such that the attenuator holders bracket and/or secure the sides of attenuator 100. Attenuator 100 may also be secured within chassis 602 in any additional and/or alternative manner.

Returning to FIG. 6, cage 202(A) of apparatus 200(A) may be coupled to chassis 602 via cage tray 208(A). Similarly, cage 202(B) of apparatus 200(B) may be coupled to chassis 602 via cage tray 208(B). In some embodiments, cages 202(A) and 202(B) may be removably coupled to chassis 602 (e.g., to enable a technician to service or repair components of apparatus 200(A) and/or apparatus 200(B)). For example, apparatuses 200(A) and 200(B) may include one or more latches and/or handles that facilitate extraction of cages 202(A) and 202(B) from their respective cage trays.

Figure 10:
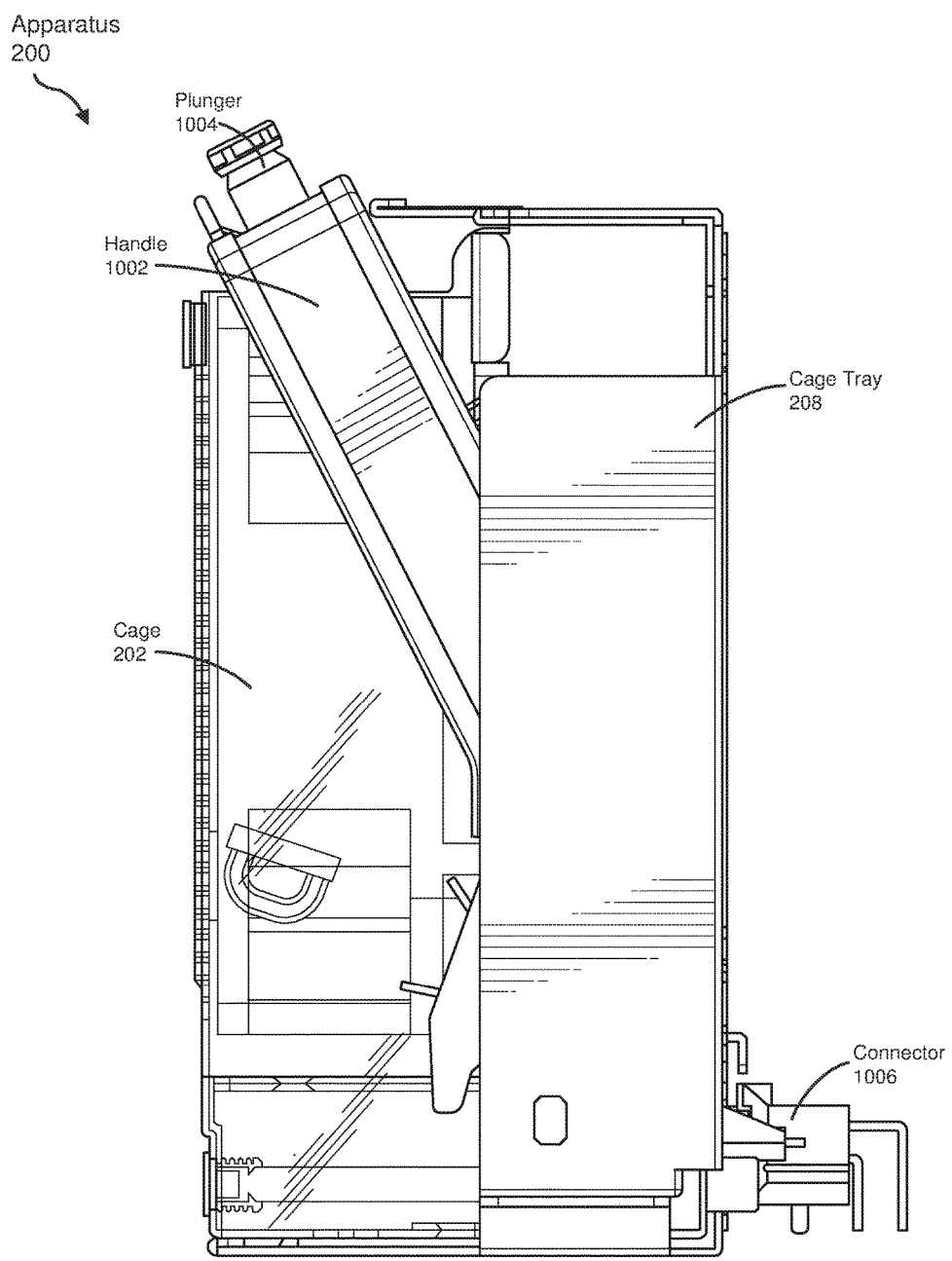
FIG. 10 is a side view of an exemplary apparatus that houses one or more exhaust fans.
Figure 11:
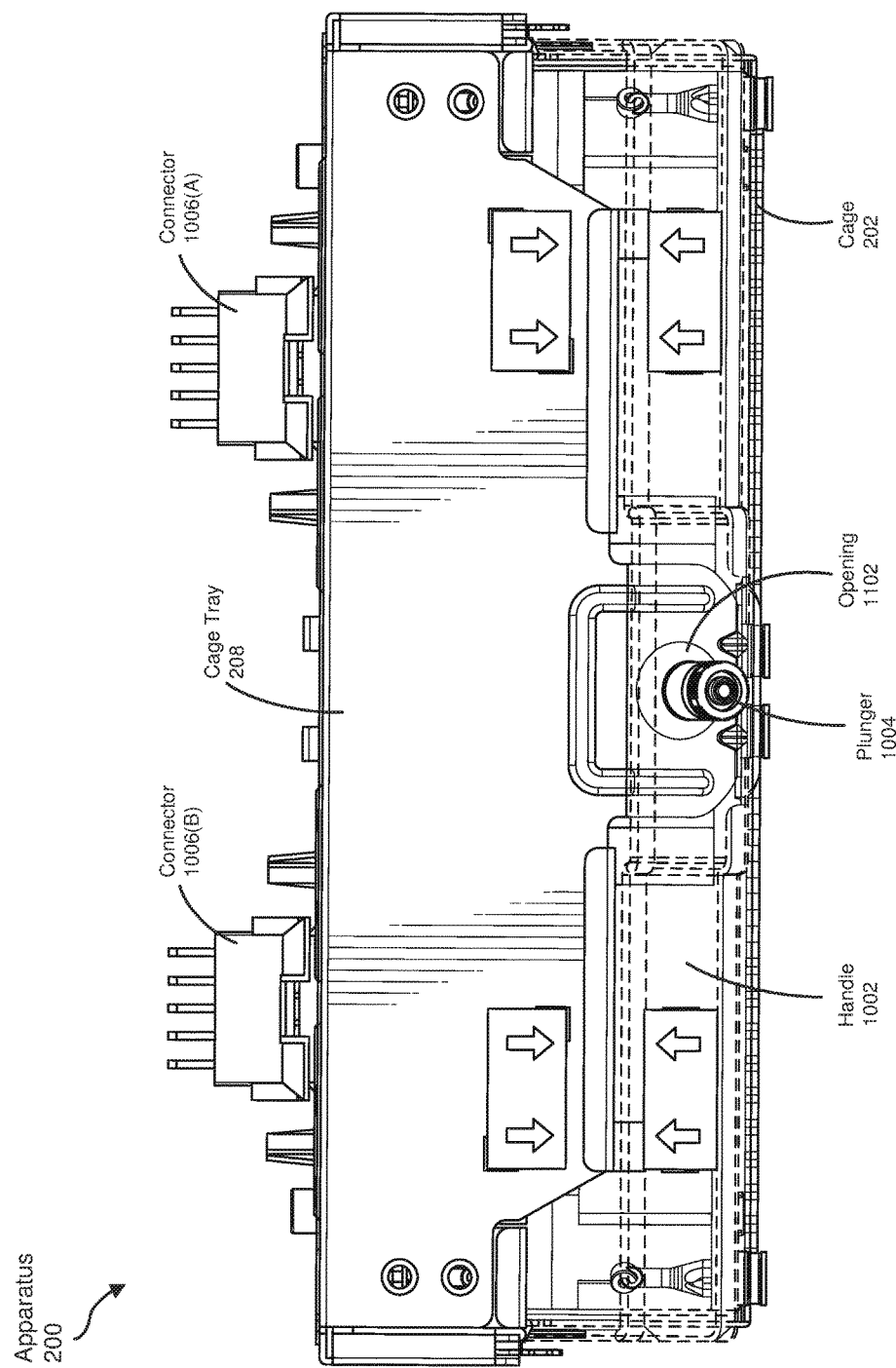
FIG. 11 is a top view of an exemplary apparatus that houses one or more exhaust fans.
Figure 12:
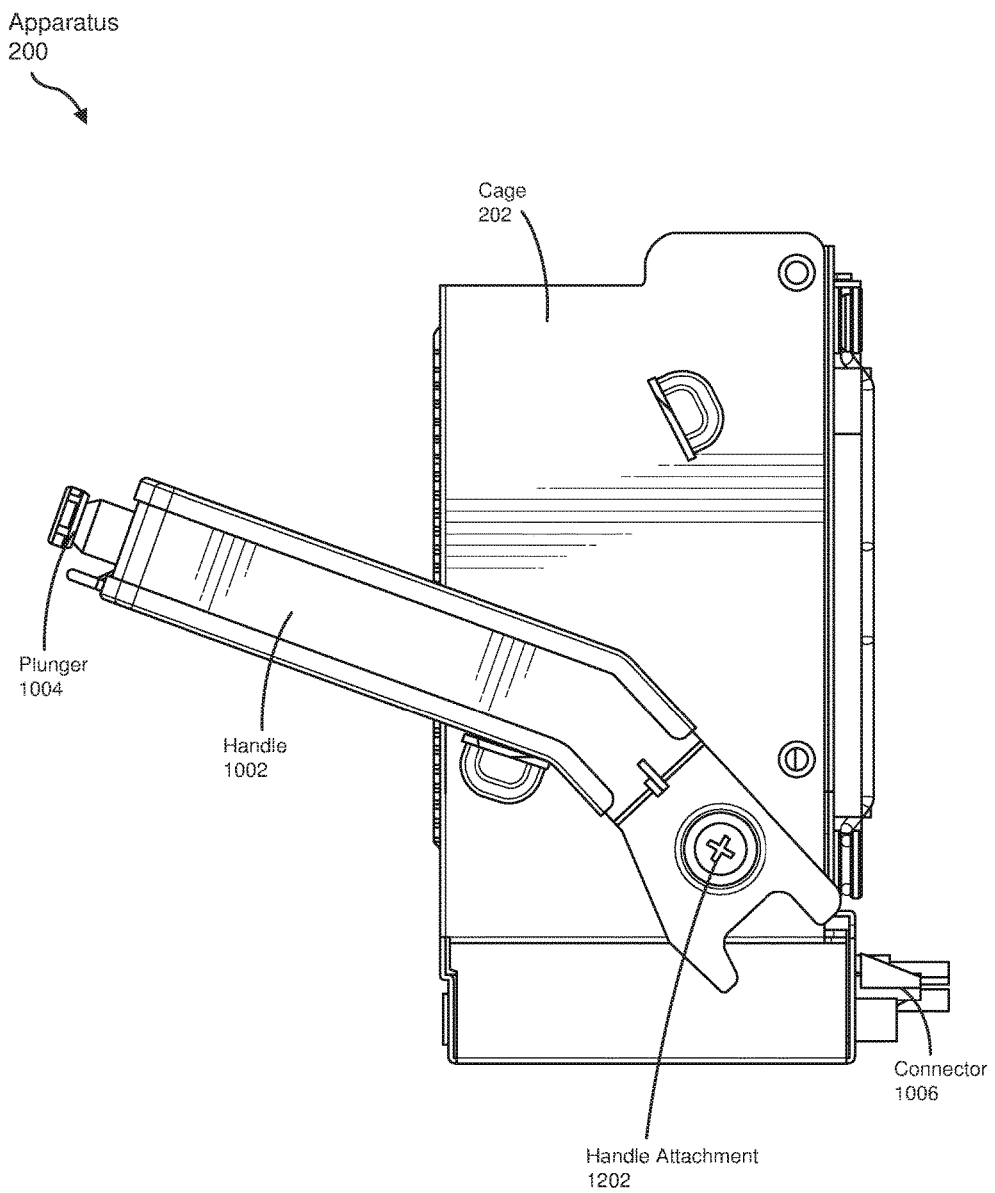
FIG. 12 is an additional side view of an exemplary apparatus that houses one or more exhaust fans.

FIGS. 10-12 show various views and/or states of apparatus 200 that illustrate the process of removing cage 202 from cage tray 208. For example, FIG. 10 illustrates an example side view of apparatus 200. In this example, a handle 1002 may be attached to one or more sides of cage 202. Handle 1002 generally represents any type or form of ergonomic lever, latch, and/or mechanism designed to be grasped, pulled, and/or pushed by a user. Handle 1002 may also be capable of being engaged with and/or disengaged from cage tray 208. In one embodiment, disengaging handle 1002 from cage tray 208 may facilitate removal of cage 202 from cage tray 208. Conversely, engaging handle 1002 with cage tray 208 may secure cage 202 within cage tray 208. In the example of FIG. 10, handle 1002 may engage with cage tray 208 via a plunger 1004. Plunger 1004 generally represents any type or form of movable latch, spring, hook, and/or other connection mechanism. In one embodiment, plunger 1004 may represent a spring-biased plunger that fits into a hole or opening within cage tray 208.

As shown in FIG. 10, apparatus 200 may also include a connector 1006. Connector 1006 generally represents any type or form of electrical and/or mechanical plug, outlet, fastener, and/or slot. In one embodiment, connector 1006 may couple cage 202 to an enclosure that houses an array of storage devices (such as chassis 602 in FIG. 6). Additionally or alternatively, connector 1006 may connect fans 204 and 206 to a processing device and/or power supply that controls and/or supplies power to the fans.

FIG. 11 illustrates an example top view of apparatus 200. Specifically, FIG. 11 illustrates an example configuration of how plunger 1004 may be engaged with cage tray 208. In this example, plunger 1004 may be part of and/or attached to handle 1002 (illustrated with dashed lines in FIG. 10). As shown in FIG. 10, plunger 1004 may be inserted into an opening 1102 within cage tray 208. In this position, handle 1002 may be engaged with cage tray 208, thereby securing cage 202 within cage tray 208. In some examples, handle 1002 may be disengaged from cage tray 208 by removing plunger 1004 from opening 1102. Plunger 1004 may be removed from opening 1102 in a variety of manners, such as by displacing and/or depressing a spring that is loaded into plunger 1004.

FIG. 12 illustrates an example side view of apparatus 200. Specifically, FIG. 12 illustrates an example state of cage 202 and handle 1002 after cage 202 has been removed from cage tray 208. As shown in FIG. 12, handle 1002 may be secured to cage 202 via a handle attachment 1202. Cage 202 may include an additional handle attachment (not illustrated in FIG. 12) that secures handle 1002 to the opposite side of cage 202. Handle attachment 1202 generally represents any type or form of bolt, screw, hinge, and/or other connection mechanism that enables handle 1002 to pivot and/or rotate. After plunger 1004 has been disengaged from cage tray 208, a technician may pull or move handle 1002 such that handle 1002 rotates around handle attachment 1202. In some examples, the technician may rotate handle 1002 until handle 1002 is perpendicular (or approximately perpendicular) to cage 202. The technician may then remove cage 202 from cage tray 208 by pulling handle 1002. To replace cage 202 within cage tray 208, the technician may insert cage 202 into cage tray 208 via handle 1002 and then re-engage plunger 1004 with cage tray 208.

Notably, a technician or other user may remove cage 202 from cage tray 208 via a simple and efficient one-handed motion. For example, handle 1002 may be designed such that depressing plunger 1004, rotating handle 1002, and pulling handle 1002 is accomplished in a continuous motion that requires only a single hand. In this way, the components of apparatus 200 may be easily and efficiently moved, inspected, and/or repaired.

FIG. 13 is a flow diagram of an example method 1200 for assembling an apparatus that dampens acoustic waves generated by exhaust fans. In one example, each of the steps shown in FIG. 13 may represent an algorithm whose structure includes and/or is represented by multiple sub-steps, examples of which will be provided in greater detail below.

At step 1310 of method 1300, one or more of the apparatuses or systems described herein may secure, within a cage removably coupled to an array of storage devices that include rotating disks, at least one exhaust fan that (1) generates airflow across the array of storage devices and (2) generates acoustic waves that produce propagating vibrations. In one example, the airflow generated by the exhaust fan may dissipate heat generated by the storage devices such that the storage devices maintain a suitable operating temperature. However, in the absence of proper dampening mechanisms, acoustic waves generated by the exhaust fan may produce vibrations that potentially interfere with rotating disks within the storage devices.

Step 1310 may be performed in a variety of ways. In one example, this step may be performed by physically installing fan 204 and/or fan 206 within cage 202. For example, a storage device manufacturer may manufacture an enclosure that houses one or more exhaust fans designed to cool an array of storage devices. In some embodiments, this enclosure may include all or a portion of apparatus 200. When manufacturing this enclosure, the manufacturer may install fans 204 and 206 into cage 202. For example, the manufacturer may secure fans 204 and 206 within cage 202 at least in part by positioning fan guard 406 over fan opening 306 and positioning fan guard 404 over fan opening 308. The manufacturer may also insert cage 202 into cage tray 208 and/or couple cage tray 208 to chassis 602.

In some embodiments, the manufacturer may design cage 202 to dampen rotational vibrations generated by fans 204 and 206. For example, the manufacturer may incorporate components such as vibration isolation material 408 and/or gusset 410 into cage 202. Additionally or alternatively, the manufacturer may design cage 202 to shield and/or contain electromagnetic radiation generated by fans 204 and 206. For example, the manufacturer may incorporate finger-guards 302 and 304 into one side of cage 202.

At step 1320 of method 1300, one or more of the apparatuses or systems described herein may incorporate, within a chassis that houses the array of storage devices, at least one acoustic attenuator that (1) includes a group of honeycomb-shaped openings that dampen the acoustic waves generated by the exhaust fan and (2) mitigates, by way of the honeycomb-shaped openings, interference to the rotating disks caused by the propagating vibrations produced by the acoustic waves.

Step 1320 may be performed in a variety of ways. In one example, this step may be performed by physically coupling and/or incorporating one or more instances of attenuator 100 into chassis 602. For example, a storage device manufacturer may manufacture chassis 602 and/or array of hard drives 604. In this example, array of hard drives 604 may be cooled by apparatus 200 that is coupled to chassis 602. When manufacturing chassis 602, the manufacturer may insert attenuator 100 into chassis 602 such that attenuator 100 is positioned between exhaust fans 204 and 206 within apparatus 200 and at least a portion of the storage devices within array 604. For example, the manufacturer may insert attenuator 100 into a slot defined by attenuator holder 704.

Once the components of apparatus 200 and/or chassis 602 have been fully assembled, fans 204 and 206 may generate airflow across array of hard drives 604. In some embodiments, attenuator 100 may dampen acoustic waves generated by fans 204 and 206. Additionally or alternatively, attenuator 100 may shield array of hard drives 604 from electromagnetic radiation generated by fans 204 and 206. As such, attenuator 100 may enable the hard drives within array 604 to operate normally and/or optimally.

In some examples, the manufacturer may facilitate removal of cage 202 from cage tray 208 by coupling handle 1002 to cage 202 and/or cage tray 208. For example, the manufacturer may secure one or both ends of handle 1002 to cage 202 via a hinge or other rotatable assembly. The manufacturer may also assemble handle 1002 such that handle 1002 is capable of being engaged with and/or disengaged from cage tray 208 (e.g., via plunger 1004). In this way, a technician may remove cage 202 from cage tray 208 by disengaging plunger 1004 from cage tray 208 and then rotating and pulling handle 1002. In some embodiments, the technician may remove cage 202 from cage tray 208 using a continuous and/or one-handed motion.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    at least one exhaust fan that:
        generates airflow across an array of storage devices that include rotating disks; and
        generates acoustic waves that produce propagating vibrations;
    at least one acoustic attenuator that:
        includes a group of honeycomb-shaped openings that dampen the acoustic waves generated by the exhaust fan; and
        mitigates, by way of the honeycomb-shaped openings, interference to the rotating disks caused by the propagating vibrations produced by the acoustic waves; and
    a cage that:
        houses the exhaust fan; and
        includes at least one additional group of honeycomb-shaped openings that are designed to shield electrical devices from electromagnetic waves generated by the exhaust fan.

2. The apparatus of claim 1, wherein:
    the array of storage devices is housed in a chassis; and
    the acoustic attenuator comprises a sheet that is inserted into a slot within the chassis.

3. The apparatus of claim 2, wherein the sheet is composed of foam designed to dampen acoustic waves.

4. The apparatus of claim 2, wherein the sheet is composed of metal that shields the array of storage devices from the electromagnetic waves generated by the exhaust fan.

5. The apparatus of claim 1, further comprising a cage tray that couples the cage to a chassis that houses the array of storage devices.

6. The apparatus of claim 5, wherein the cage further comprises at least one component that dampens rotational vibrations generated by the exhaust fan.

7. The apparatus of claim 6, wherein the component comprises a rubber gusset that at least partially secures the exhaust fan within the cage.

8. The apparatus of claim 6, wherein the component comprises a foam sheet secured to at least one side of the cage.

9. The apparatus of claim 5, wherein the cage further comprises at least one fan guard that secures the exhaust fan within the cage, the fan guard being positioned between the cage and the chassis.

10. The apparatus of claim 5, further comprising a latch that is:
    attached to the cage; and
    capable of being engaged with the cage tray and disengaged from the cage tray.

11. The apparatus of claim 10, wherein:
    engaging the latch with the cage tray secures the cage to the cage tray; and
    disengaging the latch from the cage tray facilitates removal of the cage from the cage tray.

12. The apparatus of claim 11, wherein the latch engages with the cage tray via a spring-biased plunger that is inserted into an opening within the cage tray.

13. The apparatus of claim 12, wherein the latch comprises a handle that facilitates one-handed removal of the cage from the cage tray.

14. A system comprising:
    at least one exhaust fan that:
        generates airflow across an array of storage devices that include rotating disks; and
        generates acoustic waves that produce propagating vibrations;
    at least one acoustic attenuator that:
        includes a group of honeycomb-shaped openings that dampen the acoustic waves generated by the exhaust fan; and
        mitigates, by way of the honeycomb-shaped openings, interference to the rotating disks caused by the propagating vibrations produced by the acoustic waves;
    a cage that:
        houses the exhaust fan; and includes at least one additional group of honeycomb-shaped openings that are designed to shield electrical devices from electromagnetic waves generated by the exhaust fan; and a chassis that houses:
the array of storage devices; and
the acoustic attenuator.

15. The system of claim 14, wherein the acoustic attenuator comprises a sheet that is inserted into a slot within the chassis.

16. The system of claim 15, wherein the sheet is composed of foam designed to dampen acoustic waves.

17. The system of claim 15, wherein the sheet is composed of metal that shields the array of storage devices from the electromagnetic waves generated by the exhaust fan.

18. A method comprising:
securing, within a cage removably coupled to an array of storage devices that include rotating disks, an exhaust fan that:
generates airflow across the array of storage devices; and
generates acoustic waves that produce propagating vibrations;
incorporating, within a chassis that houses the array of storage devices, at least one acoustic attenuator that:
includes a group of honeycomb-shaped openings that dampen the acoustic waves generated by the exhaust fan; and
mitigates, by way of the honeycomb-shaped openings, interference to the rotating disks caused by the propagating vibrations produced by the acoustic waves; and
incorporating, within the cage, at least one additional group of honeycomb-shaped openings that are designed to shield electrical devices from electromagnetic waves generated by the exhaust fan.

* * * * *